(12) United States Patent
Jia et al.

(10) Patent No.: US 10,476,012 B2
(45) Date of Patent: Nov. 12, 2019

(54) FLEXIBLE DISPLAY SUBSTRATE, MANUFACTURING METHOD THEREOF, AND DISPLAY PANEL

(71) Applicants: BOE TECHNOLOGY GROUP CO., LTD., Beijing (CN); Hefei Xinsheng Optoelectronics Technology Co., Ltd., Anhui (CN)

(72) Inventors: Wenbin Jia, Beijing (CN); Feifei Zhu, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/991,107

(22) Filed: May 29, 2018

(65) Prior Publication Data

US 2019/0157587 A1    May 23, 2019

(30) Foreign Application Priority Data

Nov. 21, 2017    (CN) .......................... 2017 1 1166621

(51) Int. Cl.
*H01L 51/00*    (2006.01)
*H01L 51/52*    (2006.01)
(Continued)

(52) U.S. Cl.
CPC .... *H01L 51/0097* (2013.01); *G02F 1/133305* (2013.01); *H01L 51/5237* (2013.01); *H01L 51/56* (2013.01)

(58) Field of Classification Search
CPC ............. H01L 27/3202; H01L 27/3204; H01L 27/3244–3279; H01L 51/0097;
(Continued)

(56) References Cited

U.S. PATENT DOCUMENTS

2005/0274455 A1    12/2005    Extrand
2007/0049047 A1    3/2007    Fujimoto et al.
(Continued)

FOREIGN PATENT DOCUMENTS

CN        1301289 A      6/2001
CN      101009207 A      8/2007
(Continued)

OTHER PUBLICATIONS

First Office Action for Chinese Patent Application No. 201711166621.7 dated Jan. 31, 2019.

*Primary Examiner* — Julia Slutsker
(74) *Attorney, Agent, or Firm* — Calfee, Halter & Griswold LLP (57) ABSTRACT

The present disclosure provides a flexible display substrate, a manufacturing method thereof, and a display panel, belonging to the field of display technology. The manufacturing method includes: forming a release layer structure containing a plurality of charged microspheres on a carrier substrate; forming a flexible substrate and a display device on the release layer structure; and peeling off the carrier substrate and the flexible substrate, to obtain a flexible display substrate.

16 Claims, 8 Drawing Sheets

(51) Int. Cl.
*H01L 21/56* (2006.01)
*G02F 1/1333* (2006.01)
*H01L 51/56* (2006.01)

(58) Field of Classification Search
CPC .............. H01L 51/5237; H01L 21/566; H01L 27/1266; G02F 1/133305
See application file for complete search history.

(56) References Cited

U.S. PATENT DOCUMENTS

2011/0092004 A1\* 4/2011 Kim .................... H01L 27/1266
438/28
2015/0021631 A1 1/2015 Huh et al.
2017/0345850 A1\* 11/2017 Lee .................... H01L 27/1218
2018/0212192 A1\* 7/2018 Jin ...................... H01L 51/5246

FOREIGN PATENT DOCUMENTS

| CN | 103956363 A | 7/2014 |
| CN | 105355591 A | 2/2016 |
| CN | 107001691 A | 8/2017 |

\* cited by examiner

FLEXIBLE DISPLAY SUBSTRATE, MANUFACTURING METHOD THEREOF, AND DISPLAY PANEL

CROSS REFERENCE

The present application claims the priority of Chinese Patent Application No. 201711166621.7, and filed on Nov. 21, 2017, and the entire contents thereof are incorporated herein by reference to serve as a portion of the present application.

TECHNICAL FIELD

The present disclosure relates to the field of display technologies, and in particular, to a flexible display substrate, a manufacturing method thereof, and a display panel.

BACKGROUND

With the development of display technologies, there are more and more types of display technologies, including, for example, conventional liquid crystal display technologies, organic light-emitting diode (OLED) display technologies, and electrophoretic display technologies. A flexible display can be realized by using the OLED display technology. The flexible display is a deformable and bendable display device made of a soft material, which has a wide range of applications due to its deformable and bendable characteristics.

Traditional flexible displays mainly use flexible substrates with a thickness of less than 100 μm, such as ultra-thin glass, stainless steel films, and polymers with high temperature corrosion resistance.

It should be noted that, information disclosed in the above background portion is provided only for better understanding of the background of the present disclosure, and thus it may contain information that does not form the prior art known by those ordinary skilled in the art.

SUMMARY

According to an aspect of the present disclosure, there is provided a method of manufacturing a flexible display substrate, including:

forming a release layer structure containing a plurality of charged microspheres on a carrier substrate;

forming a flexible substrate and a display device on the release layer structure; and peeling off the carrier substrate and the flexible substrate, to obtain a flexible display substrate.

In an exemplary embodiment of the present disclosure, the forming a release layer structure containing a plurality of charged microspheres on a carrier substrate includes:

forming a first buffer layer on the carrier substrate;

forming a plurality of charged microspheres on the first buffer layer; and forming a second buffer layer on the charged microspheres.

In an exemplary embodiment of the present disclosure, the charged microsphere has a diameter of 20~50 nm, and a distance between adjacent ones of the charged microspheres is 10~50 nm.

In an exemplary embodiment of the present disclosure, a charge carried by the charged microspheres is at least one of a positive charge or a negative charge, and a quantity of electric charge of the charged microspheres is 1~10 C.

In an exemplary embodiment of the present disclosure, an adhesion force between the charged microspheres and the second buffer layer is less than that between the charged microspheres and the first buffer layer; the adhesion force between the charged microspheres and the second buffer layer is 0.05~1 N/mm$^2$, and the adhesion force between the charged microspheres and the first buffer layer is 1~5 N/mm$^2$.

In an exemplary embodiment of the present disclosure, the charged microspheres include a first layer of charged microspheres and a second layer of charged microspheres, and the forming a release layer structure containing a plurality of charged microspheres on a carrier substrate includes:

forming a first buffer layer on the carrier substrate;

forming a plurality of the first layer of charged microspheres on the first buffer layer;

forming a third buffer layer on the first layer of charged microspheres;

forming a plurality of the second layer of charged microspheres on the third buffer layer; and forming a second buffer layer on the second layer of charged microspheres.

In an exemplary embodiment of the present disclosure, after forming a flexible substrate and a display device on the release layer structure, the method further includes:

forming an encapsulation layer on top surface and side surfaces of the display device, wherein the encapsulation layer is a multilayer laminated structure formed of an organic material and an inorganic material.

In an exemplary embodiment of the present disclosure, the peeling off the carrier substrate and the flexible substrate includes:

placing the carrier substrate on which the release layer structure, the flexible substrate, and the display device are formed between two carrier plates of an alternating electric field; and providing an electric field of a predetermined field strength to the carrier plate of the alternating electric field, the charged microspheres in the release layer structure vibrate up and down, and the carrier substrate and the flexible substrate are peeled off.

According to a second aspect of the present disclosure, there is further provided a flexible display substrate, obtained by the method of manufacturing a flexible display substrate described above.

According to a third aspect of the present disclosure, there is further provided a display panel, including the flexible display substrate described above.

It is to be understood that both the foregoing general description and the following detailed description are exemplary and explanatory only and are not restrictive of the disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure. Apparently, the accompanying drawings in the following description show merely some embodiments of the present disclosure, and those skilled in the art may still derive other drawings from these accompanying drawings without creative labor.

DETAILED DESCRIPTION

Example embodiments will now be described more fully with reference to the accompanying drawings. However, example embodiments can be implemented in various forms and should not be construed as limited to the examples set forth herein; rather, these embodiments are provided so that this disclosure will be more complete and complete, and will fully convey the concept of the example embodiments to those skilled in the art. The drawings are merely schematic illustrations of the present disclosure and are not necessarily drawn to scale. The same reference numerals in the drawings denote the same or similar parts, and their repeated description will be omitted.

Furthermore, the described features, structures, or characteristics may be combined in any suitable manner in one or more embodiments. In the following description, numerous specific details are provided to provide a thorough understanding of the embodiments of the present disclosure. However, those skilled in the art will recognize that the technical solutions of the present disclosure may be practiced while omitting one or more of the specific details, or that other methods, components, devices, steps, etc. may be employed. In other instances, well-known structures, methods, devices, implementations, materials, or operations are not shown or described in detail to avoid distraction and obscuring aspects of the present disclosure.

In this document, the terms "inside" and "outside" refer to the side facing towards the liquid crystal layer of an LCD (or the light emitting layer of an OLED) and the side facing away from the liquid crystal layer, respectively. For example, the inside of the base substrate refers to a layer of the base substrate towards the liquid crystal layer. In addition, terms of "up", "down", "left", and "right" are defined with respect to orientations indicated by the display device in the drawing. It should be understood that the above-mentioned directional terms are relative concepts, and they are used for relative description and clarification, which can be changed correspondingly according to the change of the orientation in which the display device is placed.

The Flexible Organic Light-Emitting Diode (FOLED) display technology is one of the OLED display technologies. Compared with the conventional flexible display, the FOLED has advantages of self-luminous display, fast response, high brightness and wide viewing angle. Besides, the FOLED is an organic material-based display, no liquid filling, which can be curled, folded, and even worn, and is a good portable product. The present disclosure describes the structure of the FOLED and its manufacturing method in the following.

Figure 1:
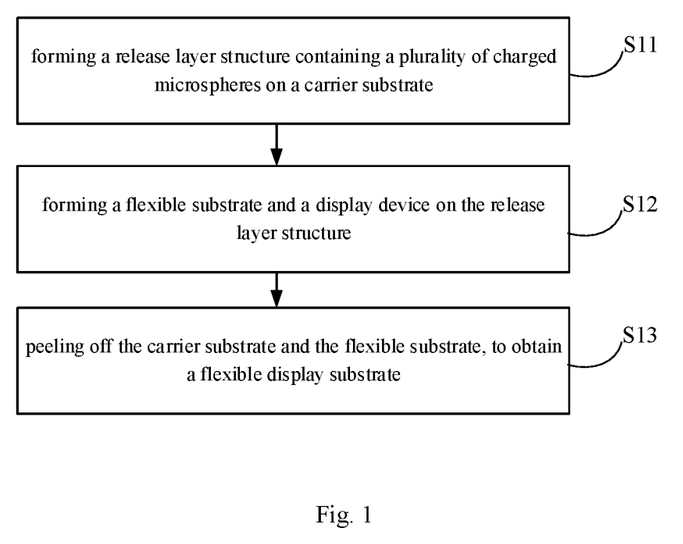
FIG. 1 shows a flowchart of a method of manufacturing a flexible display substrate provided by the present disclosure.

FIG. 1 shows a flowchart of a method of manufacturing a flexible display substrate provided by the present disclosure.

As shown in FIG. 1, in step S11, a release layer structure 110 containing a plurality of charged microspheres 112 is formed on a carrier substrate 101.

In an exemplary embodiment of the present disclosure, the carrier substrate 101 is a rigid base substrate, and a material thereof may include but not limited to: a silicon wafer, glass, a mica sheet, or other rigid carrier materials.

As shown in FIG. 1, in step S12, a flexible substrate 102 and a display device 103 are formed on the release layer structure 110.

In an exemplary embodiment of the present disclosure, the flexible substrate 102 is a flexible substrate, whose material may be a polymer, a metal sheet, or ultra-thin glass. The polymer may include but not limited to: polyimide (PI), poly Styrene (PS), polycarbonate (PC), polyacrylate, polyetherimide (PEI), polyethersulfone (PES), polyethylene terephthalate (PETS), and polyethylene naphthalate (PEN).

In an exemplary embodiment of the present disclosure, the display device 103 is an OLED that includes at least an anode, a cathode, and an organic material functional layer.

Figure 2:
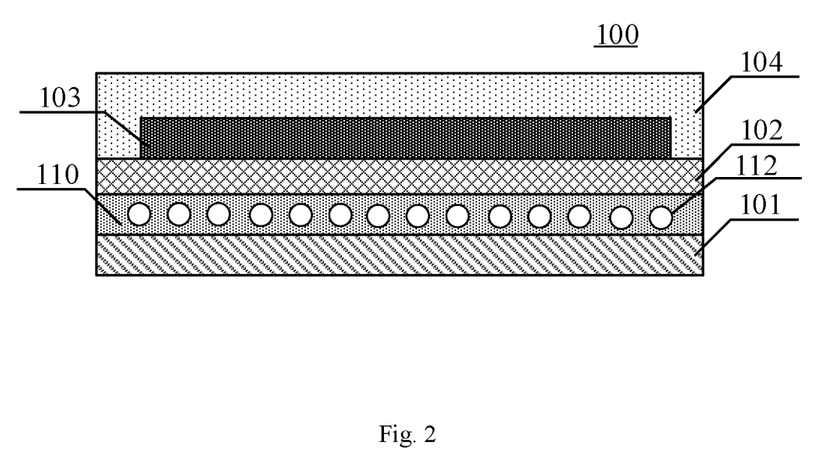
FIG. 2 shows a schematic diagram of a structure for forming a flexible display substrate on a carrier substrate by using the manufacturing method shown in FIG. 1 in the present disclosure.

FIG. 2 shows a schematic diagram of a structure for forming a flexible display substrate on a carrier substrate in this embodiment. In the present disclosure, the structure including the carrier substrate, the release layer structure, and the flexible display substrate is a motherboard. As shown in FIG. 2, the motherboard 100 further includes an encapsulation layer 104, overlying the upper and side surfaces of the display device 103.

As shown in FIG. 1, in step S13, the carrier substrate 101 and the flexible substrate 102 are peeled off, to obtain a flexible display substrate.

Since the release layer structure containing a plurality of charged microspheres is disposed between the carrier substrate and the flexible substrate, only an alternating electric field needs to be applied when carrying out the peeling of the carrier substrate. The charged microspheres can be vibrated up and down under the action of the electric field, to change interfacial properties of the release layer structure, which causes that the charged microspheres gradually separate from the buffer layer and the peeling is completed.

According to the manufacturing method shown in FIG. 1, the release layer structure between the carrier substrate and the flexible display panel contains charged microspheres. The carrier substrate can be peeled off without strong physical treatment by applying an appropriate AC electric field during the peeling. In this way, the integrity of the flexible substrate and the carrier substrate can be ensured, and the uniformity and yield of the display device can also be improved, thus reducing the cost.

The release layer structure in embodiments of the present disclosure may contain one layer, two layers or even multiple layers of charged microspheres with positive and/or negative charges. In the following two embodiments, one layer of charged microspheres and two layers of charged microspheres are taken as an example to introduce the manufacture of the flexible display substrate.

Figure 3:
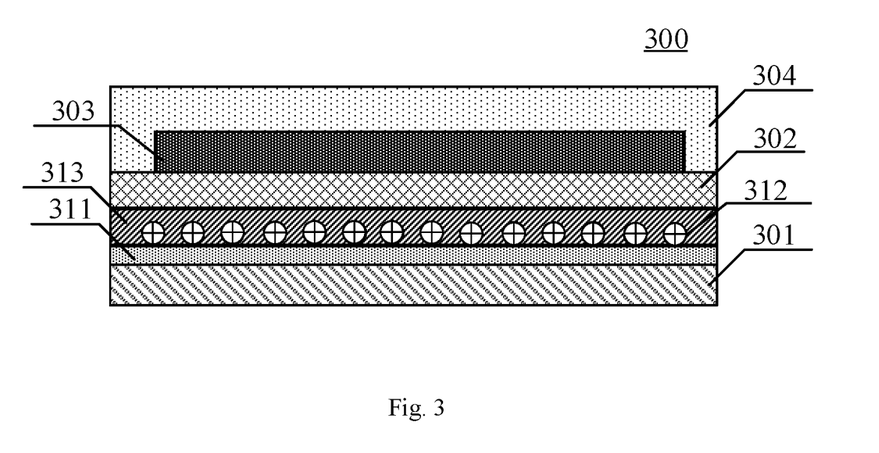
FIG. 3 shows a schematic structural diagram of a motherboard for manufacturing a flexible display substrate provided in one embodiment of the present disclosure.
Figure 7:
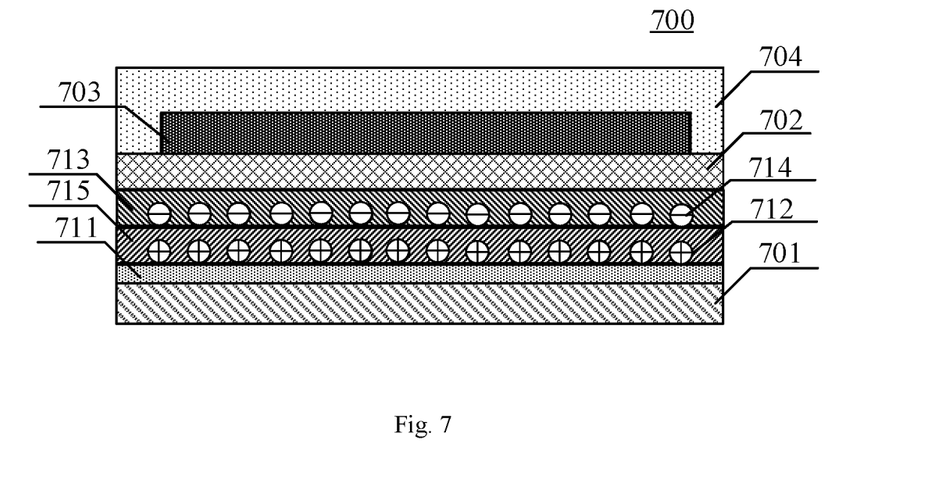
FIG. 7 shows a schematic structural diagram of a motherboard for manufacturing a flexible display substrate provided in one embodiment of the present disclosure.

FIG. 3 and FIG. 7 respectively illustrate two different schematic structural views of motherboards for manufacturing a flexible display substrate. The motherboard structure shown in FIG. 3 contains a layer of charged microspheres, and the motherboard structure shown in FIG. 7 contains two layers of charged microspheres.

FIG. 3 shows a schematic structural diagram of a motherboard provided in one embodiment of the present disclosure. As shown in FIG. 3, the motherboard 300 includes: a carrier substrate 301, a flexible substrate 302 disposed on the carrier substrate 301, and a display device 303 disposed on the flexible substrate 302; and a release layer structure containing a plurality of charged microspheres 312 being further disposed between the carrier substrate 301 and the flexible substrate 302.

As shown in FIG. 3, the release layer structure includes: a first buffer layer 311 and a second buffer layer 313. The charged microspheres 312 are distributed between the first buffer layer 311 and the second buffer layer 313. The first buffer layer 311 is disposed adjacent to the carrier substrate 301, and the second buffer layer 313 is disposed adjacent to the flexible substrate 302.

Figure 4:
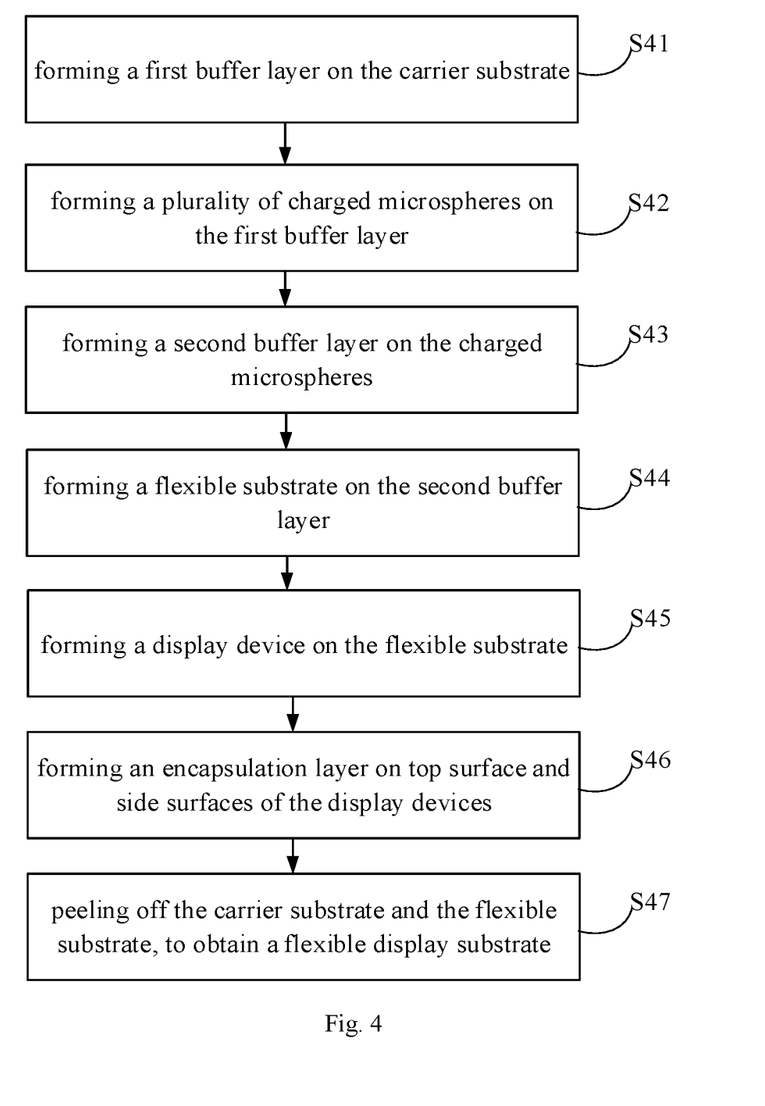
FIG. 4 shows a flowchart of a method for manufacturing a flexible display substrate based on the motherboard shown in FIG. 3 in one embodiment of the present disclosure.

FIG. 4 shows a flowchart of a method for manufacturing a flexible display substrate in the present embodiment, and the method is suitable for manufacturing a flexible display substrate based on the motherboard shown in FIG. 3.

As shown in FIG. 4, in step S41, a first buffer layer 311 is formed on the carrier substrate 301. This step can be implemented by coating the organic carrier with a rigid carrier substrate. The organic material of the first buffer layer 311 may be silicone, polyacrylate, or the like.

As shown in FIG. 4, in step S42, a plurality of charged microspheres 312 is formed on the first buffer layer 311.

This step can use self-assembly technology or printing technology. Taking the printing technology as an example, the formed charged microspheres (nano microspheres) are printed on the first buffer layer at equal intervals. The printing manner is the same in principle as that of IJP (Ink Jet Printing), except that the nozzle ejects the charged microspheres rather than ink. There are two basic types of the IJP technology: CIJ (Continue Ink Jet) and DOD IJ (Drop On Demand Ink Jet). Among them, the DOD IJ is more suitable for application in OLED processing processes due to its smaller droplet size, higher accuracy, and less requirement on the ink characteristics. The inkjet printing technology of the DOD IJ mode can disperse droplets of 150 μm or even as small as 15 μm at a frequency of 0 to 25 kHz. A piezoelectric mode is based on piezoelectric diaphragm deformation to generate acoustic pulses in a liquid column. The voltage pulse acts on the piezoelectric sensor, causing contraction and expansion of the volume of the piezoelectric sensor. A direction of the volume change depends on a structure and shape of the piezoelectric material. When the sensor is retracted, a high-pressure pressure wave ejecting ink droplet will be generated. By applying an appropriate shape of the excitation pulse to the piezoelectric diaphragm, it is possible to control that a single droplet drops on a functional substrate (that is, the first buffer layer in this embodiment). Usually, Different droplet sizes are acquired by delivering pulse signals of various frequencies. In addition, this step can also be achieved by using Slit Slot Coating or Spin Coating.

The nanostructure self-assembly manner is a process in which constituent elements (such as molecules, nanocrystals, etc.) are spontaneously organized into a certain shape and structure under unattended conditions. Generally, non-covalent interactions are used to organize the constituent elements. These non-covalent interactions include hydrogen bonds, van der Waals forces, and electrostatic forces. By selecting suitable chemical reaction conditions, ordered nanostructured materials can be formed by a simple self-assembly process. That is, such structures can be produced by their own assembly without external interference.

In an exemplary embodiment of the present disclosure, the material used for the charged microspheres 312 is an inorganic material, an organic material, or a colloidal material. For example, the material of the charged microspheres 312 includes, but not limited to: organic materials such as polystyrene PS, polypropylene PPE, inorganic materials such as $SiO_2$, and colloidal particles. The charging manners for these materials are introduced respectively in the following.

The charged microspheres with positive charge are formed by modifying $SiO_2$ microspheres with surfactants ((sodium diisooctyl succinate sulfonate)-dodecane, Span 80 (sorbitan monooleate)-dodecane, Span85 (sorbitan trioleate)-dodecane) or the like. The charged microspheres with positive and negative charges may also be formed by introducing amino, carboxyl modified polymer nanospheres. The charged microspheres with negative charge may also be formed by using colloidal particles concentrated by silicic acid moleculars, ionizing $H^+$ bp the surface silicic acid molecules, and leaving $SiO3^{2-}$ and $HSiO^{3-}$ on a surface of the colloidal particles.

In an exemplary embodiment of the present disclosure, the charged microspheres 312 have a diameter of 20 to 50 nm. Since the diameter of the charged microspheres is in the nm scale, they may also be referred to as nano microspheres. Since the release layer structure includes a plurality of charged microspheres 312, the distance between the charged microsphere 312 and the adjacent charged microsphere 312 is 10 to 50 nm. In practical applications, the diameter and the spacing of the charged microspheres 312 may both be decided according to specific design requirements. There is no over-limitation herein.

In an exemplary embodiment of the present disclosure, the charge carried by the charged microsphere 312 is a positive charge or a negative charge. The structure shown in FIG. 3 is a layer of positive charge as an example, which can be selected according to needs when used specifically. It should be noted that the structure shown in FIG. 3 includes a layer of charged microspheres 312 that may only have a positive charge, or only a negative charge, or an alternating distribution of positive and negative charges.

In an exemplary embodiment of the present disclosure, the quantity of electric charge of the charged microspheres 312 is 1 to 10 C. The specific quantity of electric charge further needs to be determined by combining with the electric field strength and the adhesive forces of the charged microsphere 312 and the adjacent first buffer layer 311 and the second buffer layer 313. Since the charged microspheres 312 have positive or negative charges, the charged microspheres can vibrate up or down under the action of the electric field force when an alternating current electric field is applied, thereby achieving the peeling of the carrier substrate.

As shown in FIG. 4, in step S43, a second buffer layer 313 is formed on the charged microspheres 312. This step can be implemented by coating. Since the surface of the first buffer layer 311 with the charged microspheres 312 formed thereon is uneven, an additional layer of buffer flat layer is formed, and then a flat surface is obtained.

In an exemplary embodiment of the present disclosure, the materials used by the first buffer layer 311 and the second buffer layer 313 are organic materials. The material of the first buffer layer 311 may be organic silicon or polyacrylate or the like that needs to have poor hydrophilicity, to have good adhesion with the charged microspheres 312. The material of the second buffer layer 313 may be a polymer modified with fluorine or a silane coupling agent, such as fluorine-modified organic silicon or polyacrylate, or some organic macromolecules of carbazole indole, etc. The second buffer layer 313 has poor adhesion with the charged microspheres 312 and belongs to a material with a small surface energy, i.e., it is hydrophobic. Therefore, the adhesion force of the charged microspheres 312 and the second buffer layer 313 is smaller than that of the charged microspheres 312 and the first buffer layer 311.

For example, the adhesion force of the charged microspheres 312 and the second buffer layer 313 may be in the range of 0.05 to 1 $N/mm^2$, and the adhesion force of the charged microspheres 312 and the first buffer layer 311 may be in the range of 1 to 5 $N/mm^2$. Besides, both the adhesion force between the charged microspheres 312 and the second buffer layer 313 and the adhesion force between the charged microspheres 312 and the first buffer layer 311 need to be less than the electric force applied during the subsequent peeling process, so that the carrier substrate 301 and the flexible substrate 302 can be successfully peeled off.

It should be noted that, in the present embodiment, a layer of the first buffer layer 311 is formed in advance before the charged microspheres 312 are formed, and then the mobility of the charged microspheres 312 can be reduced, so that it can be formed on the carrier substrate 301 stably. The second buffer layer 313 is formed on the charged microspheres 312 to form a flat surface. That is, a buffer flat layer is formed on the uneven surface having charged microspheres 312 formed thereon, so that the subsequent flexible substrate 302 can be formed on a flat surface.

As shown in FIG. 4, in step S44, a flexible substrate 302 is formed on the second buffer layer 313. The material of the flexible substrate 302 may be a polymer, a metal sheet, or ultra-thin glass. The polymer may include but not limited to: polyimide (PI), poly Styrene (PS), polycarbonate (PC), polyacrylate, polyetherimide (PEI), polyethersulfone (PES), polyethylene terephthalate (PETS), and polyethylene naphthalate (PEN).

As shown in FIG. 4, in step S45, a display device 303 is formed on the flexible substrate 302, and the display device may be an OLED.

Figure 5:
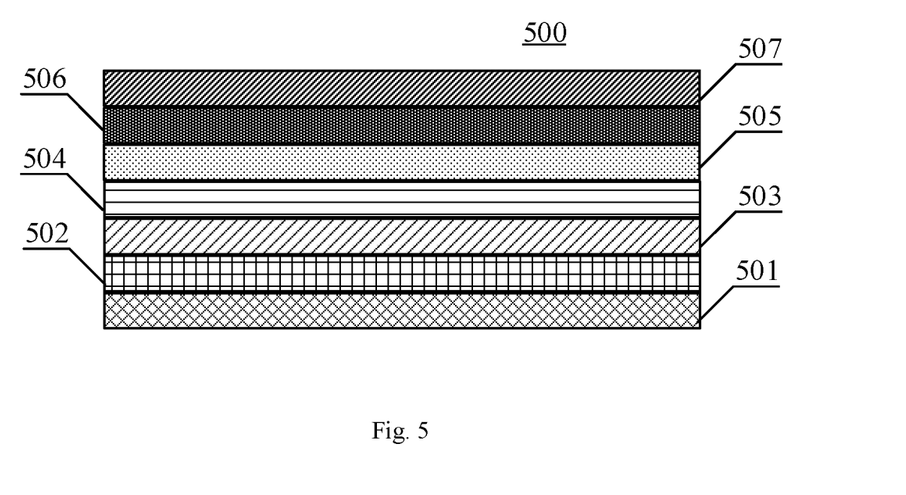
FIG. 5 shows a schematic structural diagram of a display device in the motherboard shown in FIG. 3 in an embodiment of the present disclosure.

FIG. 5 shows a schematic structural diagram of the display device. As shown in FIG. 5, the display device 500 includes at least five layers, which are: an anode 501, a hole injection layer 502, a hole transport layer 503, an organic light emitting layer 504, an electron transport layer 505, an electron injection layer 506, and a cathode 507. During the manufacturing, each layer can be formed by a common film formation and patterning process, and the film formation process usually includes deposition, coating, sputtering and other manners.

It should be noted that the patterning process in the present disclosure may include a photolithography process, or include a photolithography process and an etching step, and may also include printing, ink jetting, nanoimprinting, and other processes for forming a predetermined pattern at the same time. The photolithography process refers to a process of forming a pattern using a photoresist, a mask plate, an exposure machine and the like including a process of film formation, exposure, and development. In the actual processing, a corresponding patterning process may be selected according to the structure formed in the present disclosure.

As shown in FIG. 4, in step S46, an encapsulation layer 304 is formed on the display device 303 and on sidewalls thereof, i.e., on upper and side surfaces of the display device 303. Since the penetration of water vapor and oxygen has a great influence on the OLED display device, an excellent encapsulation will effectively separate the organic layer from the external environment and can effectively reduce the penetration of water vapor and oxygen in the air into the display device.

Figure 6:
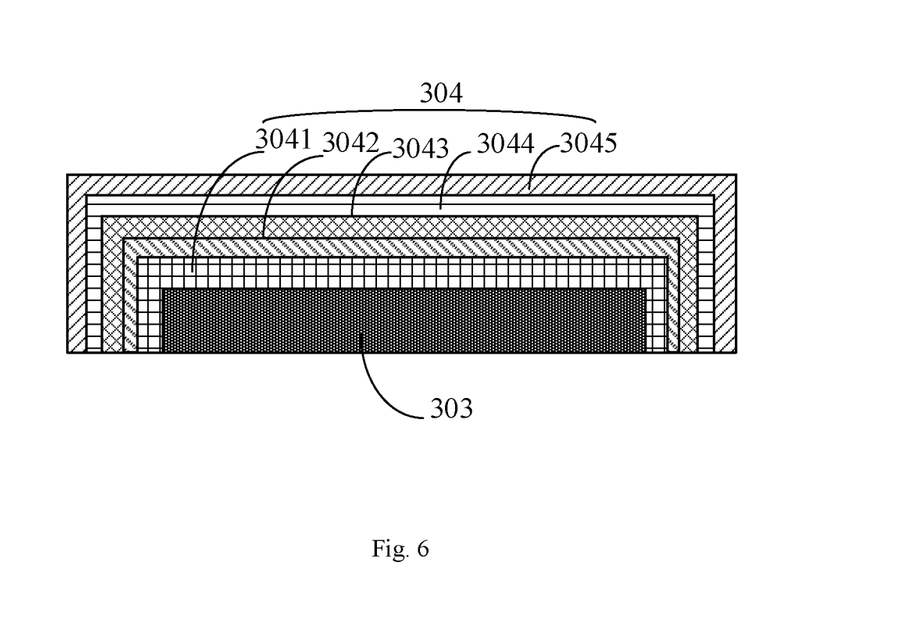
FIG. 6 shows a schematic structural view of the encapsulation layer in the motherboard shown in FIG. 3 in one embodiment of the present disclosure.

FIG. 6 shows a schematic diagram of an encapsulation layer in this embodiment. In the present embodiment, the encapsulation layer is a multilayer structure including an organic material and an inorganic material. As shown in FIG. 6, the encapsulation layer 304 includes an evaporated organic layer 3041 (any evaporated organic material may be used, currently 8-hydroxyquinoline lithium (Liq) or HATCN is used) 3041, a silicon nitride 3042, an atomic layer deposition (ALD) aluminum oxide 3043, silicon nitride silicon oxide stacked structure 3044, polyimide or polystyrene 3045 and the like deposited from inside to the outside in sequence. The multi-layered film formed of organic and inorganic materials encapsulates the OLED, and then good coating properties of the inorganic materials can be used, thus, the stress is well released, and performance of obstructing the water vapor and potassium ion from permeating is better, which ensures stability inside the OLED and prolongs service life.

As shown in FIG. 4, in step S47, the carrier substrate 301 and the flexible substrate 302 are peeled off, to obtain a flexible display substrate.

In an exemplary embodiment of the present disclosure, a carrier substrate on which a release layer structure, a flexible substrate, and a display device are formed may be first placed between two carrier plates of an alternating electric field; after that, an electric field with a preset field strength is provided to the carrier plate of the alternating current electric field, and the charged microspheres in the release layer structure vibrate up and down to achieve peeling between the carrier substrate and the flexible substrate. The preset field strength is larger than or equal to $10^8$ V/m or $10^8$ N/C, for example it may be $10^9$ V/m.

It should be noted that after the carrier substrate is peeled off in this embodiment, one side of the flexible substrate facing the carrier substrate is no longer flat due to the peeling of the charged microspheres, and a layer of uneven microstructure is formed, and the coupled light extracting rate can also be improved.

In addition, the peeled carrier substrate can be well preserved, and the buffer layer on the surface can be easily washed away by using a weak acid or a weak alkali solution, so as to avoid the occurrence of breakage of the carrier substrate caused by the strong physical treatment. In this way, the rigid carrier substrate can also be reused, further reducing the processing costs of the company.

In summary, according to the manufacturing method of the flexible display substrate provided by this embodiment, since the release layer structure containing a plurality of charged microspheres is disposed between the carrier substrate and the flexible substrate, only an alternating electric field needs to be applied when carrying out the peeling of the carrier substrate. The charged microspheres can be vibrated up and down under the action of the electric field, to change interfacial properties of the release layer structure, which causes that the charged microspheres gradually separate from the buffer layer. On one hand, it may be guaranteed that the carrier substrate and the flexible substrate are peeled off under the premise of intactness. On the other hand, the peeling process will not affect the display device, which can improve the electrical uniformity and yield of the display device and reduce manufacturing costs. On another hand, the multi-layered film formed of organic and inorganic materials encapsulates the OLED, and then good coating properties of the inorganic materials can be used, thus, the stress is well released, and performance of obstructing the water vapor and potassium ion from permeating is better, which ensures stability inside the OLED and prolongs service life.

FIG. 7 shows a schematic structural diagram of a motherboard for manufacturing a flexible display substrate provided in one embodiment of the present disclosure. As shown in FIG. 7, the motherboard 700 includes: a carrier substrate 701, a flexible substrate 702 disposed on the carrier substrate 701, and a display device 703 disposed on the flexible substrate 702, and a release layer structure containing a plurality of charged microspheres being further disposed between the carrier substrate 701 and the flexible substrate 702.

As shown in FIG. 7, the release layer structure includes: a first buffer layer 711, a second buffer layer 713, and a third buffer layer 715. The third buffer layer 715 is located between the first buffer layer 711 and the second buffer layer 713. The first buffer layer 711 is disposed adjacent to the carrier substrate 701, and the second buffer layer 713 is disposed adjacent to the flexible substrate 702.

In the structure of this embodiment, a plurality of charged microspheres is no longer distributed in one layer, but distributed in two layers. For example, the first layer of charged microspheres 712 is distributed between the first buffer layer 711 and the third buffer layer 715. The second layer of charged microspheres 714 is distributed between the third buffer layer 715 and the second buffer layer 713. Electrical properties of the first layer of charged microspheres 712 and the second layer of charged microspheres 714 are different. Taking the example shown in FIG. 7 as an example, the charge carried by the first layer of charged microspheres 712 is a positive charge, and the charge carried by the second layer of charged microspheres 714 is a negative charge. When the electrical properties of the two layers of charged microspheres are different, during the peeling process of the carrier substrate by applying the electric field, the charged microspheres with positive and negative charges are vibrated up and down under electric filed forces in upward and downward directions respectively, which may separate the carrier substrate and the flexible substrate more sufficiently.

Figure 8:
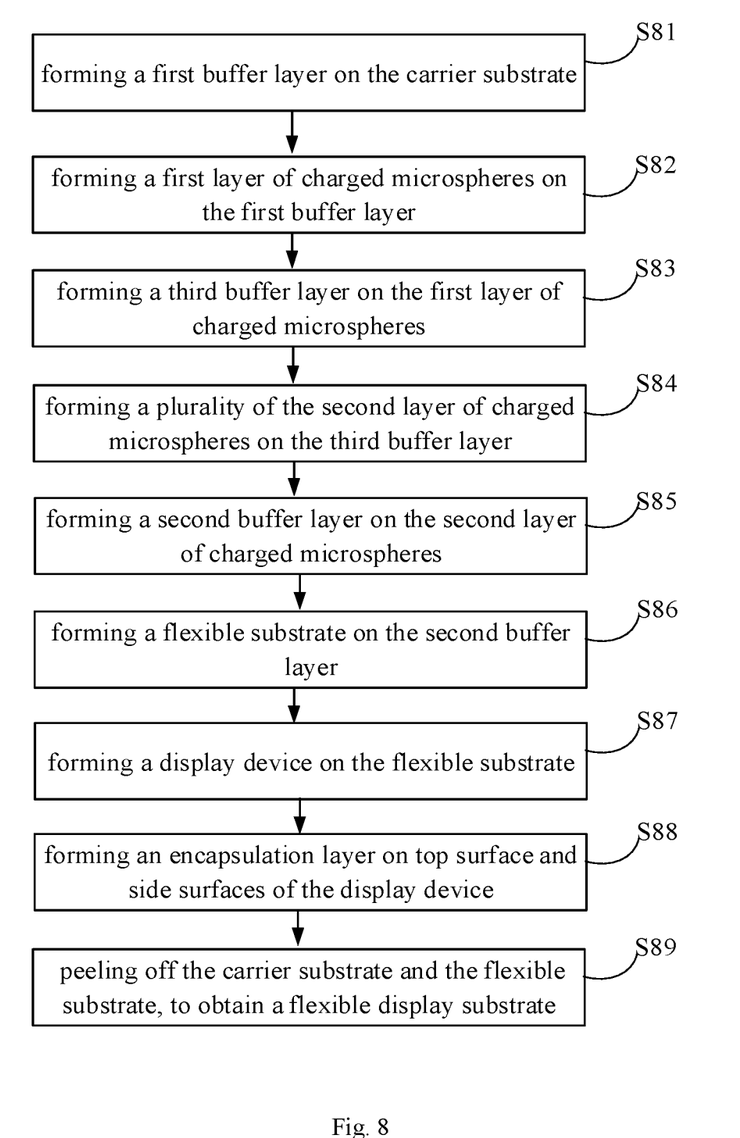
FIG. 8 shows a flowchart of a method for manufacturing a flexible display substrate based on the motherboard shown in FIG. 7 in one embodiment of the present disclosure.

FIG. 8 shows a flowchart of a method for manufacturing a flexible display substrate provided by one embodiment of the present disclosure. The method is suitable for manufacturing a flexible display substrate based on the motherboard shown in FIG. 7.

As shown in FIG. 8, in step S81, a first buffer layer 711 is formed on the carrier substrate 701. This step can be achieved by coating an organic material on a rigid carrier substrate. The organic material of the first buffer layer 711 may be organic silicon or polyacrylate or the like that needs to have poor hydrophilicity, to ensure good adhesion with the first layer of charged microspheres 712.

As shown in FIG. 8, in step S82, a plurality of the first layer of charged microspheres 712 is formed on the first buffer layer 711. This step may use a self-assembly technique or a printing technique, which may refer to the above embodiment for details.

As shown in FIG. 8, in step S83, a third buffer layer 715 is formed on the first layer of charged microspheres 712.

As shown in FIG. 8, in step S84, a plurality of the second layer of charged microspheres 714 is formed on the third buffer layer 715. This step may use a self-assembly technique or a printing technique, which may refer to the above embodiment for details.

As shown in FIG. 8, in step S85, a second buffer layer 713 is formed on the second layer of charged microspheres 714. Since the surface after forming the second layer of charged microspheres 714 is uneven, a buffer flat layer is formed additionally to obtain a flat surface.

In an exemplary embodiment of the present disclosure, materials used by the first buffer layer 711, the second buffer layer 713, and the third buffer layer 715 are organic materials, wherein the materials of the first buffer layer 711 and the third buffer layer 715 may be organic silicon or polyacrylate or the like that needs to have poor hydrophilicity, to have good adhesion with the first layer of charged microspheres 712 and the second layer of charged microspheres 714. The material of the third buffer layer 715 may be a polymer modified with fluorine or a silane coupling agent, such as fluorine-modified organic silicon or polyacrylate, or some organic macromolecules of carbazole indole, etc. The second buffer layer 713 has poor adhesion with the second layer of charged microspheres 714 and belongs to a material with a small surface energy, i.e., it is hydrophobic. Therefore, the adhesion force of the second layer of charged microspheres 714 and the second buffer layer 713 is smaller than that of the second layer of charged microspheres 714 and the third buffer layer 715.

For example, the adhesion force of the second layer of charged microspheres 714 and the second buffer layer 713 may be in the range of 0.05 to 1 $N/mm^2$, and the adhesion force of the second layer of charged microspheres 714 and the third buffer layer 715 may be in the range of 1 to 5 $N/mm^2$. Besides, the adhesion force between the second layer of charged microspheres 714 and the second buffer layer 713, the adhesion force between the second layer of charged microspheres 714 and the third buffer layer 715, and the adhesion forces between the first layer of charged microspheres 712 and the first buffer layer 711, the third buffer layer 715 all need to be less than the electric force applied during the subsequent peeling process, so that the carrier substrate 701 and the flexible substrate 702 can be successfully peeled off.

It should be noted that, in the present embodiment, a layer of the first buffer layer 411 is formed in advance before the first layer of charged microspheres 712 is formed, and then the mobility of the first layer of charged microspheres 712 can be reduced, so that it can be formed on the carrier substrate 701 stably. The third buffer layer 715 is used to separate the first layer of charged microspheres 712 and the second layer of charged microspheres 714 in different layers. The second buffer layer 313 is formed on the second layer of charged microspheres 714 to form a flat surface. That is, a buffer flat layer is formed on the uneven surface having the second layer of charged microspheres 714 formed thereon, so that the subsequent flexible substrate 702 can be formed on a flat surface.

As shown in FIG. 8, in step S86, a flexible substrate 702 is formed on the second buffer layer 713.

As shown in FIG. 8, in step S87, a display device 703 is formed on the flexible substrate 702, and the display device may be an OLED.

As shown in FIG. 8, in step S88, an encapsulation layer 704 is formed on the display device 703 and on sidewalls thereof, i.e., on upper and side surfaces of the display device 703. Since the penetration of water vapor and oxygen has a great influence on the OLED display device, an excellent encapsulation will effectively separate the organic layer from the external environment and can effectively reduce the penetration of water vapor and oxygen in the air into the display device. For the composition structure and material of the encapsulation layer, reference is made to the description of the above embodiments, which will not be repeated herein.

As shown in FIG. 8, in step S89, the carrier substrate 701 and the flexible substrate 702 are peeled off, to obtain a flexible display substrate. For a specific peeling method, please refer to the description of the above embodiment, which will not be repeated herein.

Steps S86-S89 in this embodiment are similar to steps S44-S47 in the foregoing embodiment, and will not be repeated herein.

To sum up, using the method of manufacturing a flexible display substrate provided in this embodiment can achieve the same technical effects as those of the foregoing embodiment, which will not be described herein.

Based on the above two embodiments, the release layer structure in the method of manufacturing a flexible display substrate provided by the present disclosure may further include a charged microsphere structure with more than two layers. For the structure and manufacturing method, please refer to the above-mentioned second embodiment, which will not be repeated herein.

Figure 9:
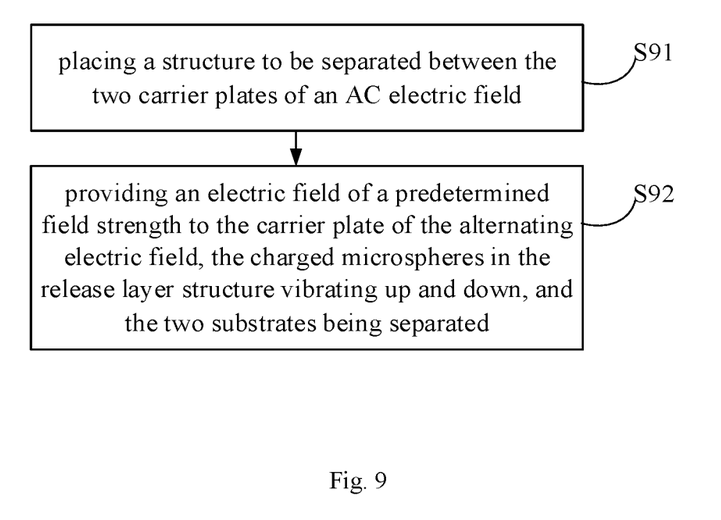
FIG. 9 shows a flow chart of a method of peeling off a substrate provided by an embodiment of the present disclosure.

FIG. 9 shows a flow chart of a method of peeling off a substrate provided by an embodiment of the present disclosure. The method can be used not only to peel the carrier substrate in the motherboard of the above embodiment, but also to peel the substrate in other structures, which is not only limited to flexible display substrates and it is not only intended for display areas.

In this embodiment, the structure of a motherboard including a single layer of charged microspheres is taken as an example. The release layer structure in this embodiment differs from that in FIG. 3 in that: the release layer structure in this embodiment is a layer of charged microspheres with positive charges and negative charges alternately distributed.

As shown in FIG. 9, in step S91, a structure to be separated is placed between the two carrier plates of an AC electric field, wherein the structure to be separated in the present embodiment includes two layers of substrates and a release layer structure containing a plurality of charged microspheres disposed between the two substrates.

As shown in FIG. 9, in step S92, an electric field of a predetermined field strength is provided to the carrier plate of the alternating electric field, the charged microspheres in the release layer structure vibrate up and down, and the two substrates are separated.

Figure 10:
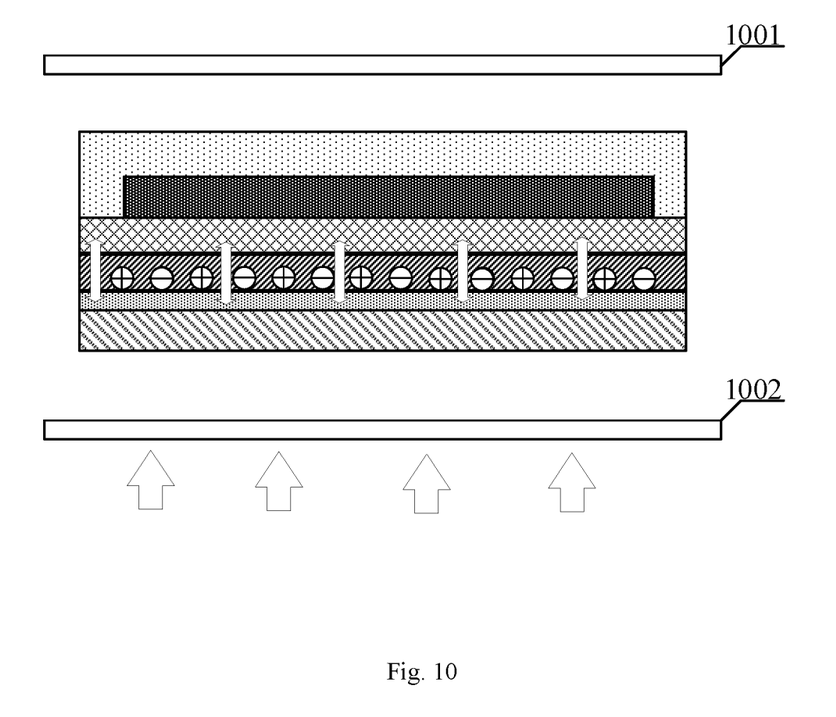
FIG. 10 shows a schematic view of a carrier substrate prior to peeling off in one embodiment of the present disclosure.
Figure 11:
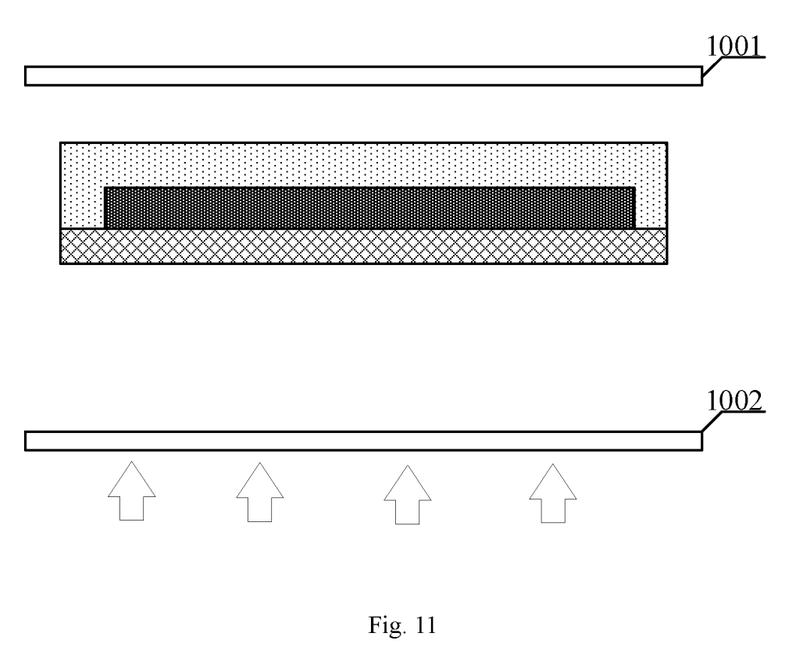
FIG. 11 shows a schematic view of a flexible display substrate obtained after the carrier substrate is peeled off according to an embodiment of the present disclosure.

FIG. 10 and FIG. 11 show schematic diagrams of the carrier substrate before and after the peeling by taking a motherboard shown in FIG. 3 as an example. FIG. 10 is a schematic diagram of the carrier substrate before peeling, and FIG. 11 is a schematic diagram of the carrier substrate after peeling. The carrier plates of the two alternating electric fields in FIGS. 10 and 11 are 1001 and 1002, respectively.

In an exemplary embodiment of the present disclosure, positive and negative alternating currents are provided to the carrier plates 1001 and 1002, and the preset field strength is larger than or equal to $10^8$ V/m or $10^8$ N/C. For example, the preset field strength may be $10^9$ V/m. When the distance between the two carrier plates of the AC electric fields is 1 cm, the applied voltage is $10^7$ V. In other embodiments, the applied voltage may also be adjusted based on specific application scenarios.

By applying an alternating electric field, the peeling of the carrier substrate can be achieved without a strong physical treatment manner, and the yield rate of the product can be improved. The substrate can be reused after being washed with a common weak acid or weak alkali solution, thereby saving costs.

In summary, using the method of peeling the substrate provided in this embodiment can guarantee that the carrier substrate and the flexible substrate are peeled off under the premise of intactness. The peeling process will not affect the display device, which can improve the electrical uniformity and yield of the display device and reduce manufacturing costs.

Another embodiment of the present disclosure further provides a flexible display substrate obtained by using the manufacturing method of the above embodiment.

FIG. 11 shows a schematic view of a flexible display substrate obtained by peeling a carrier substrate, including: a flexible substrate, a display device, and an encapsulation layer. For the materials of the structure of each layer, please refer to the description of the foregoing embodiments, and details are not described herein again.

Another embodiment of the present disclosure further provides a display panel, including the above flexible display substrate. The display panel in this embodiment can achieve the same technical effects as the flexible display substrate described above, which will not be described herein.

The present disclosure also provides a display device including the flexible display substrate in the above embodiment. It should be noted that, the display device may be any product or component having a display function such as a display panel, an electronic paper, a mobile phone, a tablet computer, a television, a monitor, a notebook computer, a digital photo frame, a navigator, and the like.

It should be clearly understood that the present disclosure describes how to make and use specific examples, but the principles of the present disclosure are not limited to any detail of these examples. Rather, based on the teachings of contents disclosed by this disclosure, these principles can be applied to many other embodiments.

The exemplary embodiments of the present disclosure have been specifically illustrated and described above. It should be understood that the disclosure is not limited to the detailed construction, arrangement, or implementation set forth herein; rather, the disclosure is intended to cover various modifications and equivalent arrangements included within the spirit and scope of the appended claims.

What is claimed is:

1. A method of manufacturing a flexible display substrate, comprising:
    forming a release layer structure comprising a plurality of charged microspheres on a carrier substrate;
    forming a flexible substrate and a display device on the release layer structure; and
    peeling off the carrier substrate and the flexible substrate, to obtain a flexible display substrate,
    wherein the step of forming a release layer structure comprising a plurality of charged microspheres on a carrier substrate comprises:
    forming a first buffer layer on the carrier substrate;
    forming a plurality of charged microspheres on the first buffer layer; and
    forming a second buffer layer on the charged microspheres.

2. The method of manufacturing a flexible display substrate according to claim 1, wherein the charged microsphere has a diameter of 20~50 nm, and a distance between adjacent ones of the charged microspheres is 10~50 nm.

3. The method of manufacturing a flexible display substrate according to claim 1, wherein a charge carried by the charged microspheres is at least one of a positive charge or a negative charge, and a quantity of electric charge of the charged microspheres is 1~10 C.

4. The method of manufacturing a flexible display substrate according to claim 1, wherein an adhesion force between the charged microspheres and the second buffer layer is less than that between the charged microspheres and the first buffer layer.

5. A method of manufacturing a flexible display substrate, comprising:
    forming a release layer structure comprising a plurality of charged microspheres on a carrier substrate;
    forming a flexible substrate and a display device on the release layer structure; and
    peeling off the carrier substrate and the flexible substrate, to obtain a flexible display substrate,
    wherein the charged microspheres comprise a first layer of charged microspheres and a second layer of charged microspheres, and the step of forming a release layer structure comprising a plurality of charged microspheres on a carrier substrate comprises:
    forming a first buffer layer on the carrier substrate;
    forming a plurality of the first layer of charged microspheres on the first buffer layer;
    forming a third buffer layer on the first layer of charged microspheres;
    forming a plurality of the second layer of charged microspheres on the third buffer layer; and
    forming a second buffer layer on the second layer of charged microspheres.

6. The method of manufacturing a flexible display substrate according to claim 1, wherein after forming a flexible substrate and a display device on the release layer structure, the method further comprises:
    forming an encapsulation layer on top surface and side surfaces of the display device, wherein the encapsulation layer is a multilayer laminated structure formed of an organic material and an inorganic material.

7. A method of manufacturing a flexible display substrate, comprising:
    forming a release layer structure comprising a plurality of charged microspheres on a carrier substrate;
    forming a flexible substrate and a display device on the release layer structure; and
    peeling off the carrier substrate and the flexible substrate, to obtain a flexible display substrate,
    wherein the step of peeling off the carrier substrate and the flexible substrate comprises:
    placing the carrier substrate on which the release layer structure, the flexible substrate, and the display device are formed between two carrier plates of an alternating electric field; and
    providing an electric field of a predetermined field strength to the carrier plate of the alternating electric field, the charged microspheres in the release layer structure vibrate up and down, and the carrier substrate and the flexible substrate are peeled off.

8. A flexible display substrate, obtained by the method of manufacturing a flexible display substrate according to claim 1.

9. A display panel, comprising the flexible display substrate according to claim 8.

10. The method of manufacturing a flexible display substrate according to claim 5, wherein after forming a flexible substrate and a display device on the release layer structure, the method further comprises:
    forming an encapsulation layer on top surface and side surfaces of the display device, wherein the encapsulation layer is a multilayer laminated structure formed of an organic material and an inorganic material.

11. The method of manufacturing a flexible display substrate according to claim 7, wherein after forming a flexible substrate and a display device on the release layer structure, the method further comprises:
    forming an encapsulation layer on top surface and side surfaces of the display device, wherein the encapsulation layer is a multilayer laminated structure formed of an organic material and an inorganic material.

12. A flexible display substrate, obtained by the method of manufacturing a flexible display substrate according to claim 5.

13. A display panel, comprising the flexible display substrate according to claim 12.

14. A flexible display substrate, obtained by the method of manufacturing a flexible display substrate according to claim 7.

15. A display panel, comprising the flexible display substrate according to claim 14.

16. The method of manufacturing a flexible display substrate according to claim 4, wherein the adhesion force between the charged microspheres and the second buffer layer is 0.05~1 N/mm$^2$, and the adhesion force between the charged microspheres and the first buffer layer is 1~5 N/mm$^2$.

* * * * *